United States Patent [19]

Chu et al.

[11] Patent Number: 5,229,322
[45] Date of Patent: Jul. 20, 1993

[54] METHOD OF MAKING LOW RESISTANCE SUBSTRATE OR BURIED LAYER CONTACT

[75] Inventors: Shao-Fu S. Chu, Poughkeepsie; Kyong-Min Kim, Hopewell Junction; Shaw-Ning Mei, Wappingers Falls; Mary J. Saccamango, Carmel; Donald R. Vigliotti, Yorktown Heights; Robert J. von Gutfeld, New York, all of N.Y.

[73] Assignee: International Business Machines Corporation, Armonk, N.Y.

[21] Appl. No.: 804,228

[22] Filed: Dec. 5, 1991

[51] Int. Cl.$^5$ .............................................. H01L 21/26
[52] U.S. Cl. .................................... 437/173; 437/25; 437/26; 437/174; 437/247; 437/248; 148/DIG. 90
[58] Field of Search .................... 437/25, 26, 31, 173, 437/174, 247, 248; 148/DIG. 90, DIG. 91, DIG. 92, DIG. 93, DIG. 94

[56] References Cited

U.S. PATENT DOCUMENTS

| | | |
|---|---|---|
| 3,940,289 | 2/1976 | Marquardt et al. |
| 4,188,710 | 2/1980 | Davey et al. |
| 4,234,356 | 11/1980 | Auston et al. .............. 148/DIG. 93 |
| 4,257,824 | 3/1981 | Jackson et al. |
| 4,431,460 | 2/1984 | Barson et al. |
| 4,489,479 | 12/1984 | Shields et al. |
| 4,569,701 | 2/1986 | Oh . |
| 4,571,275 | 2/1986 | Moksvold . |

OTHER PUBLICATIONS

R. T. Young, "Substrate Heating and Emitter Dopant Effects in Laser Annealed Cells" App. Phys. Lett. 39(4), Aug. 15 1981.
Anantha et al. "Laser Annealing Method For Making Heavily Doped Emitter Transistor" IBM TDB vol. 22, No. 2 Jul. 1979 pp. 575-576.
IBM Technical Disclosure Bulletin, Chu et al.; vol. 25, No. 1; Jun. 1982.

*Primary Examiner*—Tom Thomas
*Attorney, Agent, or Firm*—Whitham & Marhoefer

[57] ABSTRACT

An inexpensive and reliable technique for forming connections to a substrate or buried layer of a semiconductor structure employs a laser to melt a small, selected region of a lightly doped layer and a highly doped underlying layer. Extremely rapid diffusion of impurities and mixing of materials within the liquid phase of the melt quickly creates a uniformly doped conductive region when the melt is allowed to recrystallize.

12 Claims, 3 Drawing Sheets

METHOD OF MAKING LOW RESISTANCE SUBSTRATE OR BURIED LAYER CONTACT

BACKGROUND OF THE INVENTION

1. Field of the Invention

The present invention generally relates to semiconductor integrated circuit structures and, more particularly, to the formation of connections to substrates or buried layers therein.

2. Description of the Prior Art

In the fabrication of integrated circuits, it is often desirable or necessary to make connections from the front surface (e.g. the surface on which the integrated circuit is developed in successive layers) of the integrated circuit to the substrate or to a buried layer within the integrated circuit. In particular, in bipolar, FET or BICMOS (e.g. including both bipolar transistors and CMOS on a single chip) technologies, the transistors are formed on a lightly doped epitaxial layer grown on a heavily doped substrate. The heavy doping of the substrate or buried layer is done to raise the conductivity of the substrate and the light doping of the epitaxial layer results in a layer which is substantially non-conductive. However, areas or regions (e.g. of a depth less than the thickness of the epitaxial layer) of the epitaxial layer may be made selectively conductive by alteration of doping levels in order to form portions of the transistors in accordance with a particular, respective technology specific to the transistor to be formed.

In the prior art, connections to a substrate or buried layer were typically made by ion implantation in order to raise the impurity concentration profile within the desired area of the connection. However, a connection formed in this manner poses some difficulties. Consider that the layer through which a connection is to be made is likely to have a substantial thickness in comparison with layers which form parts of the transistor. While ion implantation depth may be regulated over a substantial range by control of ion energy, implantation over a range of depths requires implantation over a range of energies and may result in irregular impurity concentration profiles. This provides only a marginal solution for a mechanism for forming a connection to a substrate or buried layer. While the impurity concentration profile may be smoothed somewhat by diffusion during annealing which is also often done to repair damage to the crystal lattice due to implantation, such annealing may be difficult to reconcile with diffusion which may take place in other parts of the transistor structure which may exist at a particular point in a transistor fabrication process. Further, the thickness of the layer or layers through which the connection is to be made may exceed feasible implantation depths in a particular semiconductor structure. Moreover, such impurity implantation requires the formation of a mask which is subject to misregistration, potentially reducing production yield. At least four steps of mask formation, ion implantation, annealing and mask removal are necessary for the formation of such a connection structure, requiring time, limiting manufacturing throughput and contributing significantly to the cost of the integrated circuit device.

Possibly of more importance, however, the connection structure, described above, which is formed by ion implantation has a relatively high resistance. This implies that the area required for substrate or buried layer contact must be fairly large and preferably distributed to avoid developing different voltages in different areas of the substrate or buried layer. Often, in BICMOS technologies, a substrate or buried layer connection will be formed for each group of bipolar and CMOS transistors. In any case, the aggregate "footprint" of the connection must be of sufficient size to displace a plurality of transistors which could otherwise be formed on the chip.

Formation of connections of reduced resistance by metallization does not solve these problems. Also, masks remain necessary for opening an aperture into which metal may be deposited. Metal is also subject to fatigue or other defects due to differential thermal expansion and contraction relative to the semiconductor material employed. Adhesion to lower and overlying layers of semiconductor materials requires additional deposition or reaction steps and is also a major source of potential integrated circuit defects which may reduce production yields.

SUMMARY OF THE INVENTION

It is therefore an object of the present invention to provide a high conductivity electrical connection structure extending from a front surface of an integrated surface to a buried layer or substrate.

It is a further object of the invention to provide a connection structure extending from a front surface of an integrated surface to a buried layer or substrate which may be rapidly and reliably produced with a minimum of processing steps.

In order to achieve the above and other objects of the invention, a method of forming a connection between a front surface of a semiconductor structure and an underlying layer is provided comprising the steps of melting a selected region of the front surface to a depth within the underlying layer, and allowing recrystallization of material melted.

In accordance with another aspect of the invention, a semiconductor structure is provided including a connection formed by the steps of melting a selected region of the front surface to a depth within the underlying layer, and allowing recrystallization of material melted.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
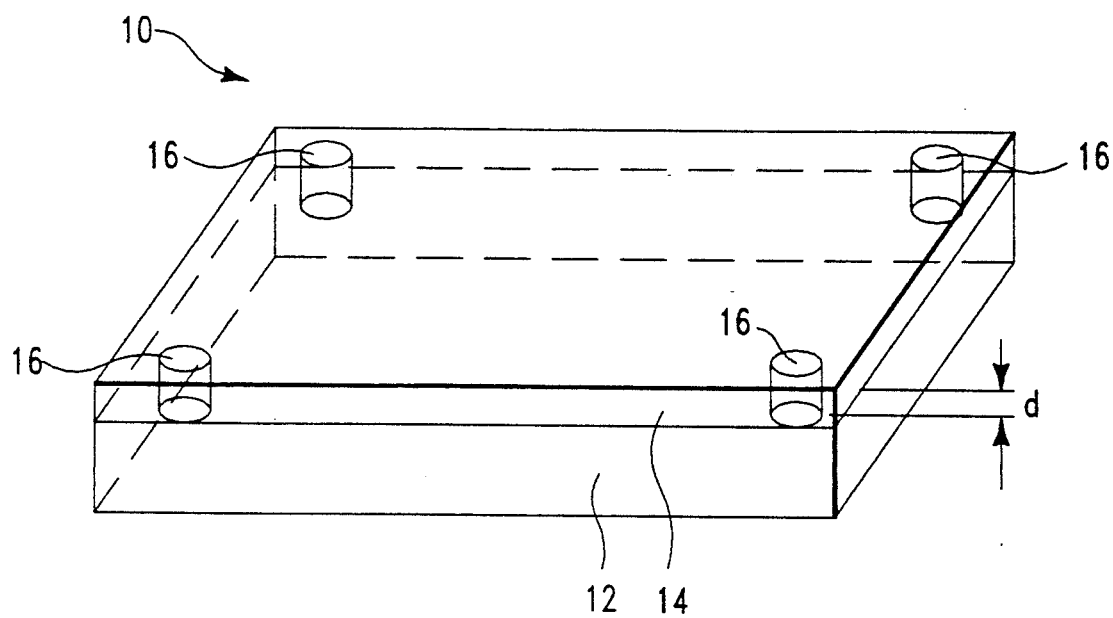
FIG. 1 is a schematic drawing of an exemplary application of the invention.

Referring now to the drawings, and more particularly to FIG. I, there is shown an exemplary pair of semiconductor layers 10 with which the present invention may be most advantageously employed. A heavily doped layer 12, in this case a P+ substrate, is overlaid by a lightly doped layer 14, in this case a P-epitaxial layer. It is to be understood that the invention may be employed with other numbers of layers, types of impurities and different crystal structures such as amorphous and polycrystalline silicon, as well as other semiconductor materials, such as germanium and compound semiconductors such as gallium arsenide. The critical element of structures for applicability of the present invention is a lightly doped or undoped layer overlying a highly doped layer of semiconductor material. It is also to be understood that a large continuous layer is not necessary to the employment of the invention since a highly doped underlying area of very limited extent is also suitable. For purposes of clarity, the term "layer" will be used throughout this disclosure but it is to be understood that limited areas or other deposits of highly doped material are considered to be encompassed by the term. It is also to be understood that the relative term "highly doped" should be considered as any impurity concentration more than about twenty times the impurity concentration in the lightly doped layer or deposit. This is so because the limited length of the connection formed in accordance with the invention will have a specific electrical conductivity comparable with the conductivity of the highly doped layer or deposit and the resistance of the connection will be negligible in comparison therewith, as will become more readily apparent in view of the discussion which follows.

This combination of doping levels is often encountered in regions where connections may be desirable. A highly doped upper layer will be conductive and connections therethrough will be inappropriate in most cases. Similarly, if the underlying layer or deposit is not highly doped, it will not be sufficiently conductive to be likely to require a connection of the low resistance of that otherwise provided by the present invention. Therefore, the invention is of wide applicability in integrated circuit fabrication.

In the exemplary application of FIG. 1, the connections 16 are made to the substrate and a plurality of connections are placed in each of the corners of the chip in order to minimize gradients due to IR drops in the substrate. This layout nevertheless greatly reduces the number of connections typical of the prior art as discussed above. The connections are depicted as being of an ideal cylindrical shape for purposes of clarity but which is not realizable in practice. The important feature of the illustration of FIG. 1 is that the connections extend through the lightly doped layer and for a short distance d within the underlying highly doped layer.

Simply put, the connection according to the invention is formed by laser melting of a volume corresponding to a small area of a lightly doped layer and the underlying substrate or layer to a depth of about 2-10 micrometers below the interface of these layers or other depth sufficient to obtain a sufficient total quantity or content of impurity in the melt from contributions of all layers affected by the melt to raise the average impurity concentration of the entire volume of the melt to a desired level. Such a desired level, under most circumstances would be greater than 5% of the impurity concentration in the most highly doped layer of the layers affected by the process and involved in the connection so formed in order to minimize the area required for the connection. However, if this is not possible for any reason, the area of the connection could be increased to reduce the resistance of the connection. Since the connection extends well into the substrate or buried layer, the area of the connection is enhanced, as compared to a surface connection at the interface. At the same time, the length of the connection is short and the specific conductivity of the material in the connection need only be a fraction (e.g. 5% to 10%) of the specific conductivity of the layer to which the connection is made in order to present a negligible resistance. The impurities in the melt, originally present in the highly doped layer or substrate 12, will diffuse with extreme rapidity in the liquid phase melt and, upon recrystallization, will provide high electrical conductivity. The area of the melt region 16 can be easily controlled by limitation of laser beam diameter, with or without focussing optics.

Incidentally, while the size of the melt region 16 may be kept small, a region around the melt region will also be thermally affected. Therefore, in the practice of the invention, it is necessary to provide sufficient space around the melt region where diffusion from the melt into the lightly doped layer will be of little consequence to other structures of the chip. As will be noted in an example below, the diameter of this thermally affected region depends on the time the melt is maintained and can be controlled accordingly.

Figure 2:
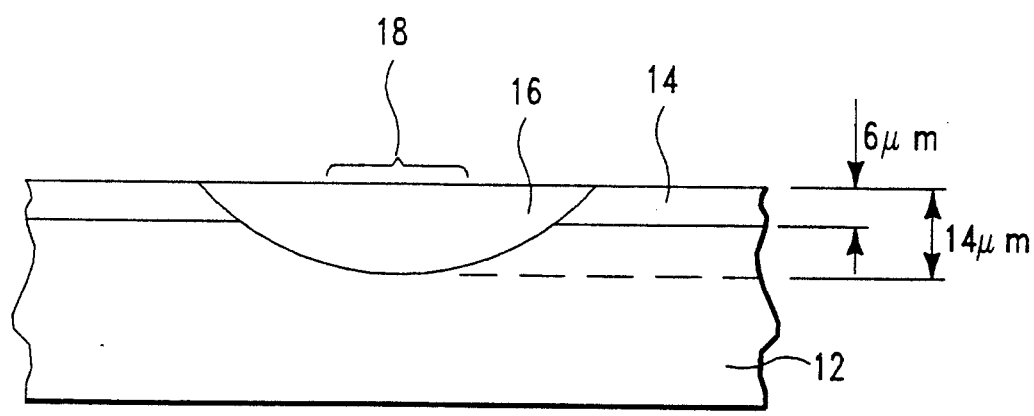
FIG. 2 is a cross-sectional view of a contact formed in accordance with the invention.

Referring now to FIG. 2, a cross-section of a connection formed in accordance with the invention is shown. This cross-section is obtained from a series of three laser pulses of 0.2 seconds each and may be flattened due to the loss of heat by radiation from the surface at which the laser beam strikes the semiconductor material. When the layered structure similar to that of FIG. 1 is irradiated with a laser, the energy of the laser beam is rapidly absorbed by the semiconductor material producing a heated region 18 at the surface of the material. Heat is conducted through the semiconductor material and, once melting has begun, possibly by convection currents within the melt. These mechanisms result in a melt having a cross-sectional shape in the form of a meniscus or near-spherical surface. It is important, but not critical, to the practice of the invention that the bottom of the meniscus extend into the underlying layer to a distance slightly greater than the thickness of the lightly doped, upper layer, although this may be adjusted depending on the actual impurity concentrations in the respective layers. However, if the bottom of the meniscus extends to a depth in the highly doped layer of about 20% to 50% greater than the thickness of the lightly doped layer, the volume of each material contributing to the melt will be reasonably similar, allowing easy approximation of the impurity concentration in the connection as an average of the concentrations in the respective layers. In fact, some additional diffusion takes place from the highly doped material adjacent to the melt which tends to raise the impurity concentration in the melt. Therefore, a depth of the melt of about 2-10 micrometers into the highly doped layer will generally supply a sufficient amount of impurity material to develop a highly conductive connection, although it may be necessary to increase this depth if the lightly doped layer is particularly thick or if the impurity concentration profile prior to melting is not sufficiently steep, as will be discussed in more detail below. As noted above, diffusion in the liquid phase melt is extremely rapid and a virtually constant impurity concentration will be obtained in any case.

An estimate of the time for good mixing in the melt may be made by considering the diffusion length as being several times the melt depth (determined from the volume of highly doped material necessary to provide a desired quantity of impurity for the volume of the connection) and setting the diffusion length so obtained approximately equal to twice the square root of the product of the diffusion coefficient of the impurity and the time the melt is maintained. The important factors therefore are (1) to insure the melting of a sufficient volume of material and the obtaining of diffusion of impurities from a sufficient further volume of highly doped material to supply a sufficient amount of impurity content for the entire volume of the melt and (2) to maintain the melt for a sufficient period of time to assure good mixing.

For example, the diffusion coefficient of boron in liquid silicon is about $1 \times 10^{-4}$ cm$^2$/sec. A laser pulse of 0.2 seconds will result in a melt region depth of 14 $\mu$m and a diffusion length of about 90 $\mu$m. Since the diffusion length is over five times the melt depth, good mixing is assured.

An example of the program of laser pulses to produce the melt cross-section of FIG. 2 is three 0.2 second pulses with a duty cycle of approximately 67% with a final laser spot size of 20-50 micrometers diameter and a total incident power of about 10 watts. It is helpful in enhancing diffusion and mixing through the melt to use a pattern of overlapping exposures which vary by about 10 micrometers center-to-center. Such overlapping exposures have the effect of altering the position of the maximum temperature within the melt and effectively stirring the melt by enhancing diffusion of impurities toward regions of higher temperature. Such shifting of the laser beam location alters the pattern of convection currents in the melt as well as disturbing the melt by irregular thermal expansion of regions of material within the melt, thus enhancing distribution of impurities. A typical resistance of the connection formed in this manner will be on the order of less than ten ohms.

Generally, further diffusion from the thermally affected area immediately beyond the melt need not be considered since such further amount of impurity is relatively small and serves to enhance the electrical conductivity of the connection. However, the melt period also affects the size of the thermally affected area around the connection site since thermal diffusion is rapid at elevated temperatures close to the melting point of the semiconductor material. A typical diameter of the thermally affected area which may be on the order of several millimeters is quite acceptable for substrate connections which are generally formed in the corners of the semiconductor device or integrated circuit, as shown in FIG. 1, but may pose limitations of applicability of the connection structure unless the melt time is limited and controlled precisely.

Figure 3:
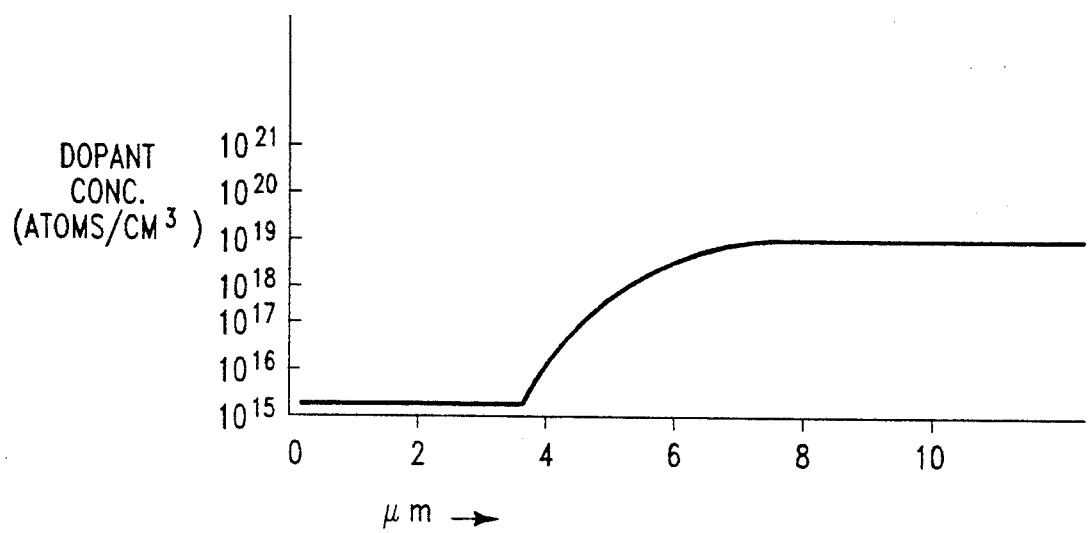
FIG. 3 is a graphical representation of an impurity concentration profile over a short distance on either side of the substrate-epitaxial layer interface of FIG. 1.
Figure 4:
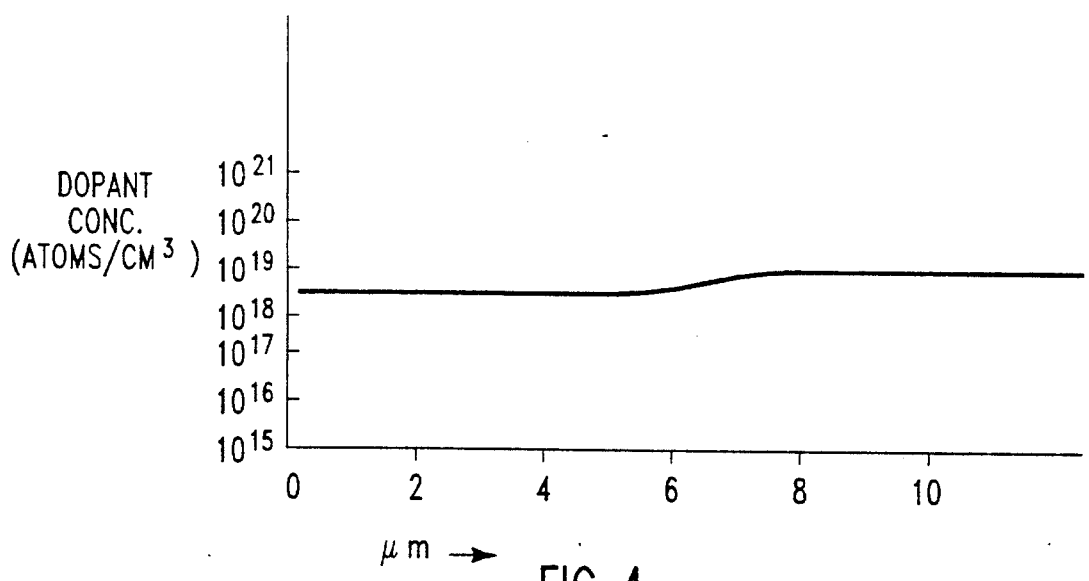
FIG. 4 is a graphical representation of the impurity concentration profile through a connection formed in accordance with the invention.

Referring now to FIGS. 3 and 4, the impurity concentration profiles near the interface between layers will be considered. FIG. 3 shows the impurity concentration profile before melting and FIG. 4 shows the impurity concentration profile within the completed connection. The horizontal axis scale shows depth from the front surface of the lightly doped layer. The vertical scale is logarithmic and the curve shown is generally proportional to the specific conductivity (or the inverse of the specific resistance).

In FIG. 3, a relatively constant low level of dopant concentration is shown to a depth of about 3.5 micrometers. The impurity concentration rises rapidly over the next approximately 3.5 micrometers to a concentration, in this example, of about 10,000 times the impurity concentration of the lightly doped layer. The thickness of the epitaxial layer in this particular example was 6 micrometers. This impurity concentration profile is typical of the profile of a lightly doped epitaxial layer grown over a highly doped substrate; the gradient of impurity concentration being caused by diffusion into the epitaxial layer during growth of that layer at 1100° C. If, as in this example, melting is done to a final depth of about 14 $\mu$m (about 8 $\mu$m into the highly doped layer, in accordance with the above guidelines) the impurity concentration profile of FIG. 4 is obtained.

FIG. 4 shows that the impurity concentration within the melt is virtually constant and less than a factor of ten below the concentration in the highly doped layer. Some decrease in impurity concentration is evident at a depth from 7 to 8 micrometers below the front surface of the lightly doped layer, possibly evidencing some diffusion from the highly doped layer below the melt. More importantly, however, the smooth slope of the nearly horizontal impurity concentration profile at a concentration near the concentration of the highly doped layer indicates extremely good diffusion and mixing of the impurity containing material through the melt to a depth well below the interface of the layers. It is also important to note that the impurity concentration in the recrystallized melt is far higher than can be obtained through impurity implantation and the specific conductivity of the connection formed according to the invention is up to 20 times greater than connections made in accordance with the prior art. Thus, potentially, the connections according to the invention need occupy no more than 1/20 of the area of the prior art connections in order to achieve comparably small resistance, thus demonstrating the high utility of the present invention in integrated circuits of high integration density. The specific conductivity of the connection will be reduced by much less than a factor of ten from the specific conductivity of the highly doped layer and will be negligible in comparison therewith because of the short length of the connection and relatively high area due to the meniscus shape.

Figure 5:
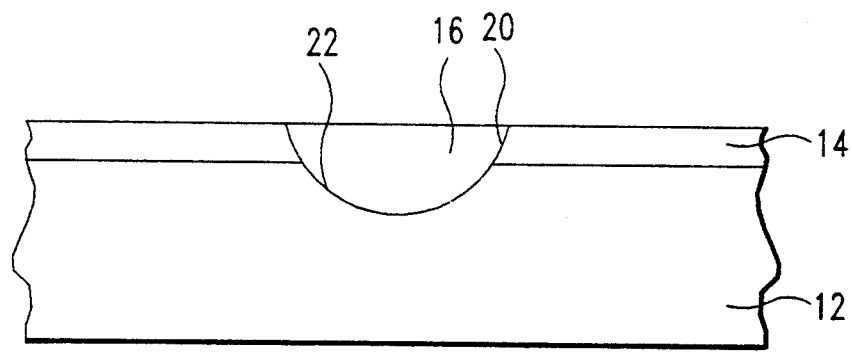
FIG. 5 is a cross-sectional view of a contact formed in accordance with a preferred variation of the invention.

Referring now to FIG. 5, a technique for further minimizing the melt area of the connection is shown in a cross-section similar to that of FIG. 2. In the case of FIG. 5, the chip is preheated to approximately 500° C. prior to laser irradiation. In this case, the heat conduction from the small area of laser energy absorption is more nearly hemispherical, depending on how closely the melting point of silicon can be approached during preheating consistent with impurity diffusion in the remainder of the structure. As is apparent from a comparison of FIGS. 2 and 5, preheating allows the volume of the melt to be driven deeper and limited in diameter. Accordingly, the depth of the melt 16 into the highly doped layer 12 may more nearly approach the thickness of the lightly doped layer 14 since the volumes will be more nearly equal as the section of the melt 16 becomes more nearly hemispherical. Further, it is important to observe that the more nearly vertical fringes or edges 20 of the melt zone which extend, in the lightly doped layer, beyond the extent of the melt in the highly doped layer, significantly reduces the melt area relative to the area 22 of the connection 16. Also, the more nearly hemispherical shape of the melt zone increases the effective area 22 of the connection in comparison with the melt section of FIG. 2.

Figure 6:
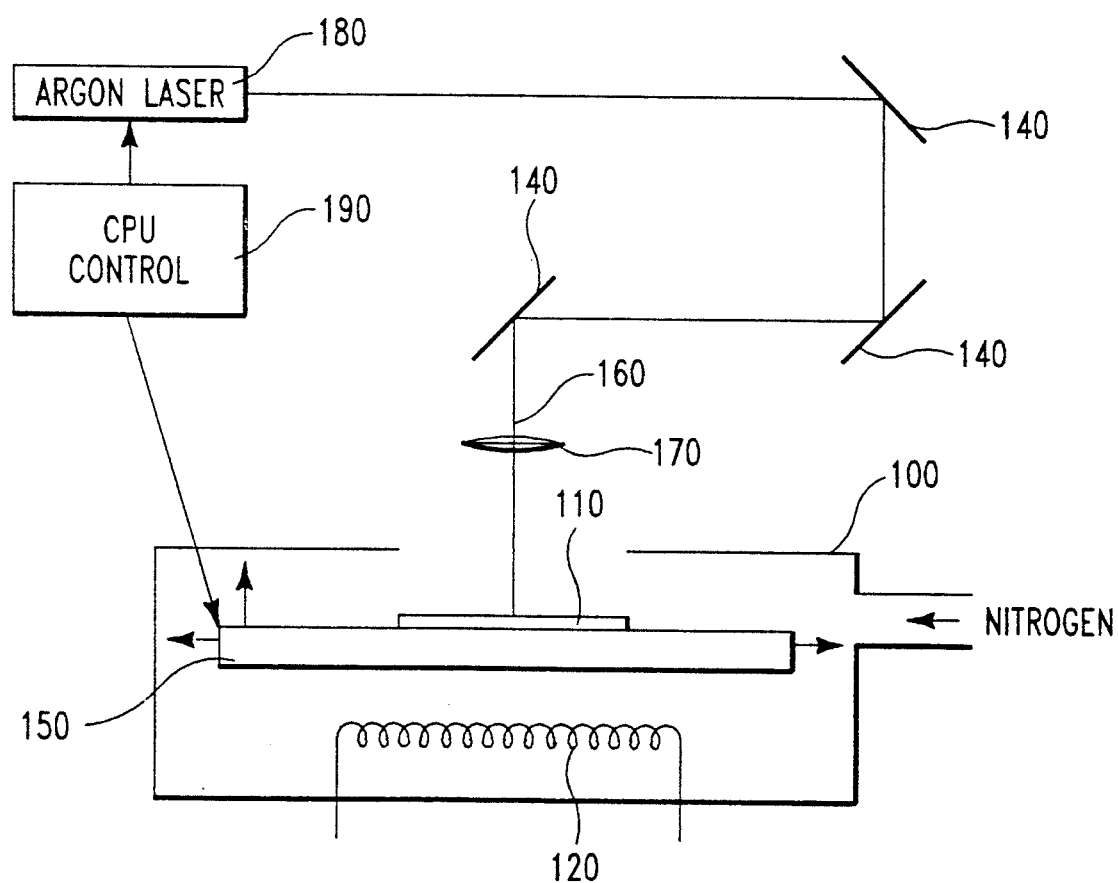
FIG. 6 is a schematic diagram of apparatus for producing connections in accordance with the invention.

The apparatus for forming the connections according to the invention is shown schematically in FIG. 6. The laser melting process is preferably conducted in a non-oxidizing atmosphere of nitrogen at relatively high pressure sufficient to prevent evaporation from the melt. This atmosphere is preferably maintained by supplying nitrogen gas to a chamber 100 containing the wafer or chip 110 and a heater 120 for preheating the same. Circulation of the gas should be minimized to limit evaporation. Laser radiation is directed to desired locations on the wafer or chip by a deflection system schematically indicated by mirrors 140. Alternatively, a computerized precision movable stage 150, such as an Anorad TM table, can be provided for providing motion in two or three coordinate directions for positioning the wafer or chip relative to the laser beam 160. Irradiation is preferably provided by an argon ion laser 180 of about 4-20 Watts at a wavelength of 488 nm and/or 514 nm under control of computer 190. In this particular case, both wavelengths of light were applied as a matter of convenience. The wavelength of laser irradiation is chosen to limit energy absorption by the gas in the chamber and maximize absorption by the semiconductor material. The laser radiation is preferably condensed to a particularly small spot by a 10.0 cm focal length condensing lens 170. Pulses of radiation from the laser are produced in accordance with empirical data based on preheating temperature and desired dimensions of the melt region as well as dopant concentrations in the respective layers.

In view of the above, it will be appreciated by those skilled in the art that a connection structure and method of producing the same has been provided which requires only a single step of laser irradiation which can be inexpensively and reliably performed and which produces a connection from a front surface to a buried layer which is much reduced in resistivity, area or both in comparison with the prior art.

While the invention has been described in terms of two preferred embodiments, those skilled in the art will recognize that the invention can be practiced with modification within the spirit and scope of the appended claims.

Having thus described my invention, what I claim as new and desire to secure by Letters Patent is as follows:

1. A method of forming a connection between a front surface of a semiconductor structure and at least one of a highly doped buried layer and a highly doped substrate beneath an undoped or lightly doped layer comprising the steps of
   melting a selected region of said front surface to a depth within said buried layer or substrate, and
   allowing recrystallization of material melted during said melting step.

2. A method as recited in claim 1, wherein said melting step is carried out to a depth of approximately 2-10 micrometers within said at least one of a buried layer and a substrate.

3. A method as recited in claim 1, wherein said melting step is carried out to a depth of within said at least one of a buried layer and a substrate which is at least equal to a distance between said at least one of said buried layer and said substrate and said front surface of said semiconductor structure.

4. A method as recited in claim 1, further including preheating of said semiconductor structure prior to said melting step.

5. A method as recited in claim 4, wherein said preheating step is carried out to a temperature below a melting point of a material included in said semiconductor structure.

6. A method as recited in claim 4, wherein said preheating step is carried out to a temperature equal to or less than 500 degrees C.

7. A method as recited in claim 1, wherein said melting step comprises the step of irradiating said selected region with at least one laser pulse.

8. A method as recited in claim 7, wherein said irradiating step comprises irradiation of said selected region with a plurality of laser pulses.

9. A method as recited in claim 8, wherein said plurality of laser pulses have a duty cycle in excess of 50%.

10. A method as recited in claim 8, wherein each pulse of said plurality of laser pulses is slightly displaced from the location of a preceding pulse within said selected region.

11. A method as recited in claim 7, wherein said irradiating step is performed with an argon ion laser.

12. A method as recited in claim 1, wherein said melting step includes melting a volume of material of said at least one of said buried layer and said substrate and at least one overlying layer such that impurity contributions to said volume of material from said at least one of said buried layer and said substrate and at least one overlying layer are sufficient to provide an average impurity concentration in said volume of material which is at least 5% of the impurity concentration in one of said at least one of said buried layer and said substrate and at least one overlying layer.

* * * * *